United States Patent [19]

Loszewski

[11] Patent Number: 5,024,889
[45] Date of Patent: Jun. 18, 1991

[54] SURFACE TREATMENT FOR SILICON CARBIDE FILAMENTS AND PRODUCT

[75] Inventor: Raymond C. Loszewski, Windham, N.H.

[73] Assignee: Avco Corporation, Providence, R.I.

[21] Appl. No.: 324,180

[22] Filed: Mar. 16, 1989

[51] Int. Cl.$^5$ .................. B32B 9/00; B32B 18/00; D02G 3/00
[52] U.S. Cl. ............................ 428/368; 428/367; 428/373; 428/375; 428/391
[58] Field of Search ............ 428/367, 366, 375, 373, 428/368, 391

[56] References Cited

U.S. PATENT DOCUMENTS 4,315,968  2/1982  Suplinskas .................. 428/367
4,340,636  7/1989  Debolt ........................ 428/368

Primary Examiner—George F. Lesmes
Assistant Examiner—J. M. Gray
Attorney, Agent, or Firm—Abraham Ogman

[57] ABSTRACT

The invention relates to a surface treatment for silicon carbide filaments. A carbon-rich silicon carbide layer or coating is formed over the silicon carbide surface. The ratio of silicon to carbon in the carbon-rich silicon carbide layer varies from 1 (stoichiometric) at the silicon carbide filament interface to about 0.43 (70% carbon, 30% silicon) at the exterior surface of the carbon-rich layer. A preferred method of making the carbon-rich silicon carbide layer is also presented.

7 Claims, 3 Drawing Sheets

SURFACE TREATMENT FOR SILICON CARBIDE FILAMENTS AND PRODUCT

BACKGROUND OF THE INVENTION

The present invention is applicable to silicon carbide and carbon surfaces of all shapes and sizes. It is particularly important for filaments, thin strips, and the like. The following discussion will be directed to filaments as a typical example.

1. A silicon carbide (SiC) monofilament is a monofilament that derives its properties from a bulk layer of essentially stoichiometric SiC.

2. An outer layer or surface coating is a layer of material deposited on a SiC monofilament. A surface layer may be deposited directly on the bulk layer or on an intermediate layer of material positioned between the bulk layer and the exterior layer.

3. For purposes of this invention, the term "carbon-rich SiC layer" shall apply to a carbonaceous SiC containing layer or surface on a SiC monofilament where the ratio of silicon to carbon is less than stoichiometric but may contain up to 75% carbon. Previous coatings (for example, U.S. Pat. No. 4,340,636) contained up to 100% carbon.

Composite materials in plastic or metal matrices reinforced with high-strength, high-modulus filaments such as boron and silicon carbide are finding increased popularity in structural applications. In particular these types of composites are useful where high-strength and stiffness with accompanying low weight is desired.

The field of technology defined as high-strength, high-modulus monofilaments is unique and ultracritical to changes in structure or process of manufacture.

Persons skilled in the art of high-strength, high-modulus filaments have observed that it is frequently not possible to predict what effect changes in compositions, processes, feedstocks, or post-treatments will have on the properties of this unique family of filaments.

Boron nitride, boron carbide, titanium nitride, titanium carbide, and tungsten in combination with boron or silicon carbide monofilaments in specific applications have failed to provide a useful monofilament, though in each instance, the candidate material was chosen to enhance one or more properties of the high-strength monofilament.

One form of a silicon carbide surface layer on a silicon carbide monofilament would not protect the filament from degradation unless the coating had a critical cross-section profile. See U.S. Pat. Nos. 4,340,636 and 4,415,609.

Carbon cores heretofore required buffer layers deposited at critical specific temperatures. See U.S. Pat. No. 4,142,008.

Forms of carbon-rich silicon carbide surface layers on SiC monofilaments which exhibit high tensile strengths were found wanting in transverse strength for example, when the monofilaments were used to form metal matrix and resin matrix composite materials. See U.S. Pat. Nos. 4,340,636 and 4,415,609.

Other structural or manufacturing procedural features which were found to be of a critical nature are change in core composition and surface texture, the presence or absence of a buffer layer of specific compositions, impurities, and reactivity of a surface coating with matrix material.

SiC Monofilaments

The basic SiC monofilament comprises a core, generally of carbon or tungsten, about 0.5 to 1.5 mils (where 1 mil is defined as 0.001 inches) in diameter upon which a relatively thick stoichiometric SiC coating, commonly called the bulk layer or bulk SiC, is deposited.

To improve or tailor properties, intermediate layers and surface treatments in many forms have been tried and used. U.S. Pat. No. 4,340,636 referred to previously depicts what is considered the baseline commercial SiC monofilament commonly called SCS-2 monofilament. It contains a carbon-rich intermediate buffer layer with a trough between the core and bulk layer.

U.S. Pat. No. 4,628,002 is directed to providing a silicon carbide monofilament having an improved transverse strain to failure ratio. There is deposited on the bulk SiC of the monofilament a thin layer of fine grain SiC and finally an outer layer or zone in which the Si/C ratio decreases to form a carbon-rich trough and then increases to provide a surface essentially of pure silicon. Each layer performs a critical function necessary to achieve the improved transverse strain to failure ratio.

Attention is directed to the carbon trough as this trough is still a limitation to further improved transverse performance.

The foregoing discussion is provided to emphasize that even small variations in structure and/or processing can lead to unexpected and/or critical improvement.

OBJECTIVES OF THE INVENTION

It is an object of the present invention to provide an improved SiC monofilament structure and method which avoids the limitations and disadvantages of prior SiC structures and methods.

Another object of the present invention is to provide an improved surface layer for SiC monofilaments.

A still further object of the present invention is to provide a surface layer for SiC monofilaments having improved transverse properties when composited with metal alloys during casting, diffusion bonding, or hot molding consolidation processes as well as with plastic matricies.

A still further object of the present invention is to provide a surface layer for SiC filaments that is readily wet by most metals, plastics and ceramics while retaining resistance to peeling and separation.

A still further object of the present invention is to provide a high-strength silicon carbide monofilament having a surface layer which has no carbon trough.

These and other objects of the invention will in part appear hereinafter and will in part become apparent after consideration of the specification with reference to the accompanying drawings and the claims.

SUMMARY OF THE INVENTION

The present invention provides a unique and critical SiC surface layer for coating SiC monofilaments that may be produced by a deposition method of the type described in U.S. Pat. No. 4,315,968. Surface layers are typically constructed by continuously passing the silicon carbide monofilament through a chemical vapor deposition reactor which is charged with a mixture of propane, silanes and a carrier gas such as nitrogen, hydrogen, or argon and heating to an appropriate temperature somewhere between 1000° C. and 1500° C. Temperature, concentration of reactants, and resident time of the filament within the reactor determines coating thickness and composition.

The optimum thickness of the carbon-rich surface layer is about 1-2 microns for aluminum, however, the optimum thickness may vary with the intended matrix material and with the composite fabrication procedure. For example, because titanium reacts with SiC at molding or consolidation temperatures, thicker surface layers are needed to protect the titanium from reacting with the bulk layer. A thickness of 3-4 microns is advised.

The novel features that are considered characteristic of the invention are set forth in the appended claims.

BRIEF DESCRIPTION OF THE DRAWINGS

For a fuller understanding of the nature and desired objects of the present invention, reference should be made to the following detailed description taken in conjunction with the accompanying drawings wherein like reference characters denote corresponding parts throughout several views and wherein.

DETAILED DESCRIPTION OF PREFERRED EMBODIMENT(S)

Figure 1:
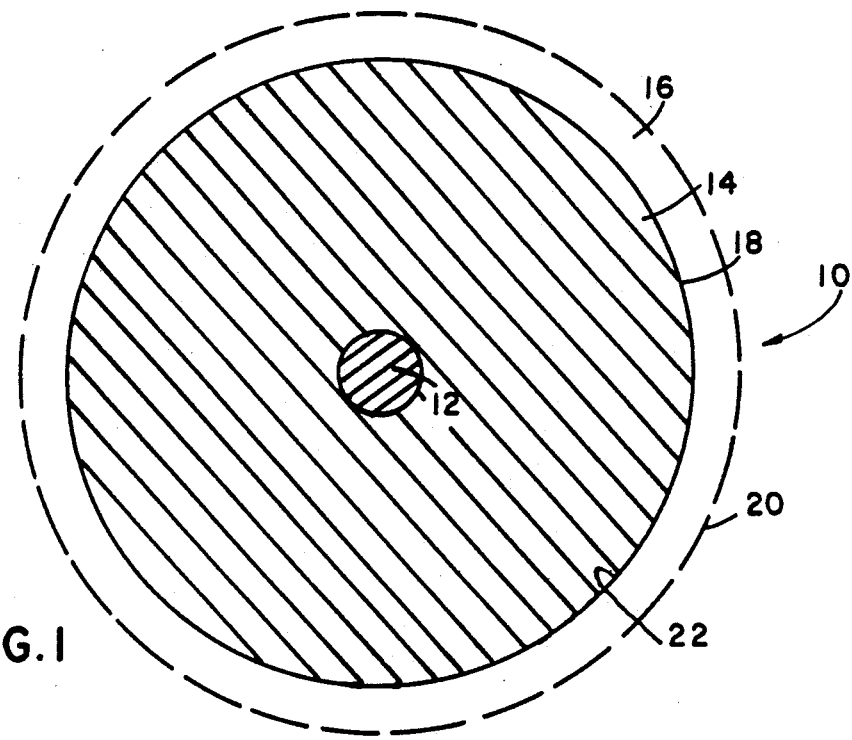
FIG. 1 is a cross-sectional representation of one embodiment of a SiC monofilament containing a surface layer embodying the principals of the present invention.

Referring now to FIG. 1 of the drawing, there is shown generally by the numeral 10 a cross-section of a silicon carbide monofilament embodying the principals of the present invention. More particularly, the monofilament contains a core 12 and a bulk layer 14 of stoichiometric SiC on the core 12. The bulk layer 14 is substantially free of excess carbon or silicon. A carbon-rich surface layer 16 is shown on the monofilament 10. The surface layer 16 is one wherein the silicon to carbon ratio changes almost linearly from 1 (stoichiometric) at the interface 18 of the SiC bulk layer 14 to about 0.43 (70% carbon, 30% silicon) at the exterior surface 20.

Figure 2:
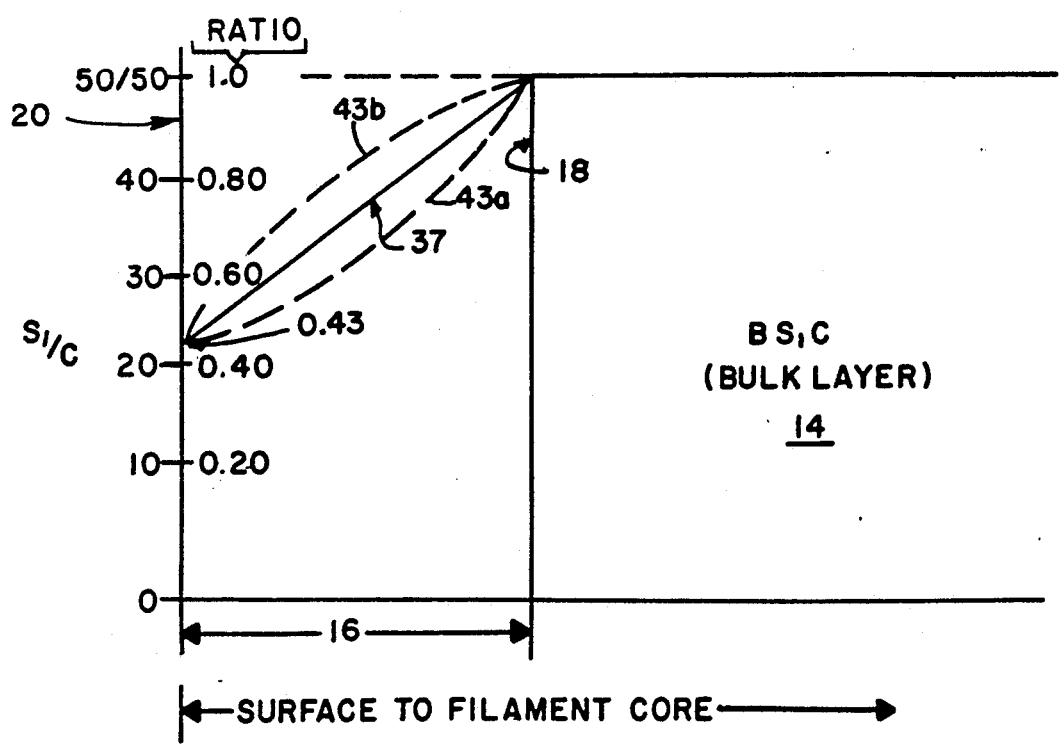
FIG. 2 is a curve useful in describing the silicon to carbon ratio of the surface coating as a function of distance from the SiC bulk layer of the monofilament of FIG. 1.

FIG. 2 depicts graphically and qualitatively the composition of the carbon-rich surface layer produced as illustrated in FIG. 2 in accordance with the invention. As mentioned previously, the Si/C ratio of the carbon-rich layer 16 starts out as 1 (the stoichiometric ratio) at the interface 18 of the SiC bulk layer surface 22 and decreases as the layer 16 is constructed and is essentially about 0.43 at the exterior surface 20. The thickness or depth of the layer 16 is preferably on the order of 1 micron although variations in thickness can be tolerated and may be preferable depending upon the intended matrix material and composite fabrication procedure.

Figure 3:
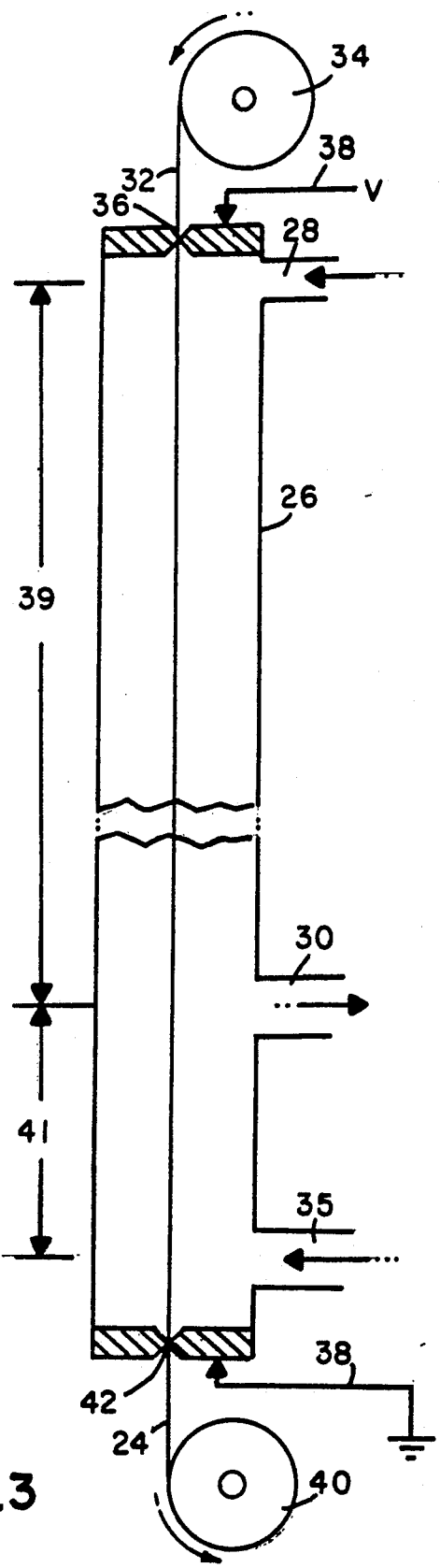
FIG. 3 is a schematic representation of a vapor deposition reactor for making the SiC monofilament and carbon-rich surface layer of FIG. 1.

Referring to FIG. 3, the coated monofilament 24 is preferably made in an elongated reactor 26 having a first input port 28 and an exhaust port 30. A second input port 35 is provided. A monofilament core 32 is supplied to the reactor 26 from a spool 34 threaded through a jewel orifice 36 into the body of the reactor 26. The reactor 26 includes a second jewel orifice 42 and a take-up spool 40.

In the FIG. 3 illustration, the core 32 and monofilament 24 are resistively heated within the reactor 26 between jewel orifices 36 and 42 by passing an electric current, from a source 38, through the core and monofilament. Temperature control, either generally or locally, may also be provided by induction heating, convection cooling or use of lasers, etc.

the core is heated as it passes through the orifice 36 and subsequently contacts reagents entering port 28. The reagents supplied to the reactor are typically a mixture of 18%-28% chlorinated organosilanes and 72%-82% hydrogen. The reagents decompose and deposit stoichiometric siC on the core 32 as the core 32 moves toward the exhaust port 30 for spent reagents.

Whereas the bulk layer 14 is produced between the inlet port 28 and the exit port 30, the carbon-rich surface layer is deposited on the bulk layer in the section of the reactor between exit port 30 and the second inlet port 35.

In the past a typical reactor comprised a first section 39 comprising about 6 feet in length in which the bulk layer 14 was deposited. A second section 41 of about 2 feet in length was provided to construct the surface layer on the SiC monofilament. A direct result of this configuration was the construction of a surface coating having a carbon trough, such as illustrated in U.S. Pat. No. 4,628,002, where the silicon content is close to zero. A stated objective of this invention is to eliminate the carbon trough as it represents a relatively weak layer which limits the tansverse strength of the monofilament.

The carbon trough is eliminated by preferentially depositing silicon carbide while inhibiting the deposition of free carbon in section 41. The procedure will be better understood with reference to FIG. 4 where there is shown the relative deposition rates of carbon and SiC as a function of the deposition temperature.

The carbon is derived from propane and the SiC from silanes which are supplied to the reactor section 41 through the second input port 35.

A carbon-rich SiC coating actually includes free carbon interspersed between stoichiometric SiC. Thus when the ratio of Si to C is mentioned or quantified, a portion of the C is combined with Si and a portion is free carbon. For example, in a layer which is said to have a Si to C ratio of 1 to 3, ⅔ of the carbon content is in the form of free carbon and ⅓ is combined with Si as SiC.

In accordance with the invention the deposition at given flow rates in section 41 is limited to about 1250° C. or less. In this range SiC deposits out at a faster rate than the carbon. The surface layer produced under these conditions does not have a carbon rich trough because the temperature of the reactants at the surface of the fiber is purposely kept below the point at which the carbon deposition rate would exceed that for SiC.

In prior practice a 5.6 mil monofilament for example, when passed through a 2 foot section 41 saw a deposition temperature of about 1400° C. to 1500° C. at the exit port 30. At these temperatures the deposition of carbon is favored (see FIG. 4) and consequently a carbon trough results. The composition of the rest of the surface coating is largely a function of the temperature profile throughout the section 41.

Figure 4:
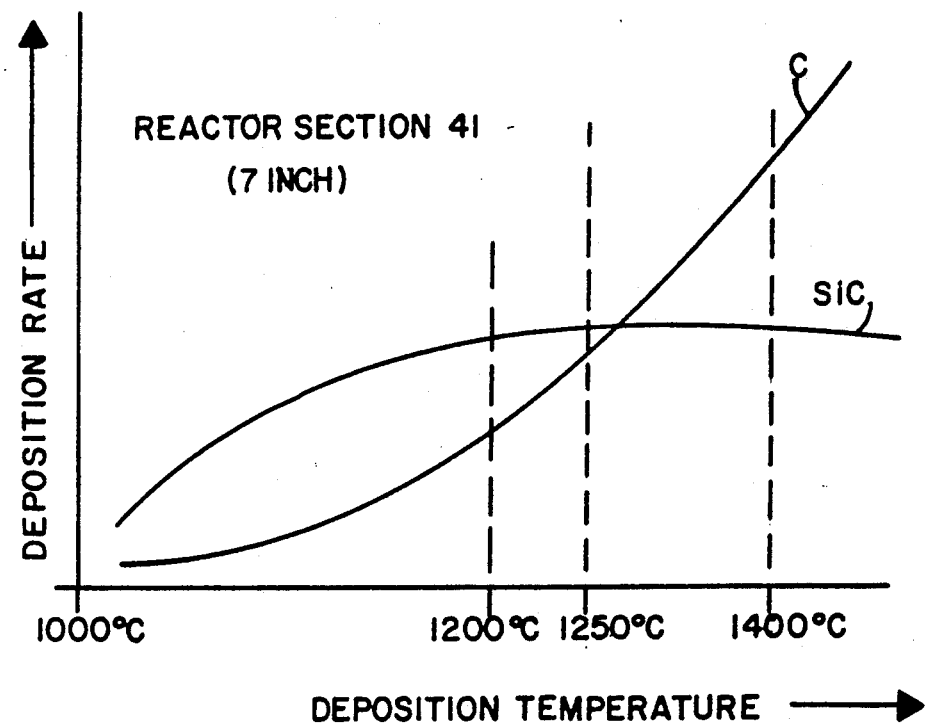
FIG. 4 is a curve which is believed to be representative of the deposition rates of Si and C as a function of deposition temperature.

In the practice of the present invention a 7 inch section 41 is used (see FIGS. 3 and 4). The reagents entering input port 35 are exhausted before they have time to heat up sufficiently to preferentially deposit carbon on the SiC monofilament. The temperature of the silanes and propane in the vicinity of the exit port 30 ranges from 1200° C. to about 1250° C. As shown in FIG. 4, this is at about the point where the deposition of SiC and carbon are about equal.

The deposition temperatures and surface coating composition in section 41 may also be controlled by adjusting the speed at which the monofilament travels in the reactor. The proportion of carrier gas to reagents affects the thermal conductivity, heat capacity and hence the temperature profile in section 41. Gas flow rates and conditions affect nucleation and grain growth in SiC where comparable structures may be obtained at temperatures in excess of 1250° C.

Where a 5.6 mil (0.0056 inch) SiC monofilament travels through a 7 inch section 41 at the rate of about 12 feet per minute and where the ratio of propane to silane is about 2 to 1 and the overall gas flow rate is about 0.3 liters per minute, a surface layer 16 having a nearly linear cross-sectional distribution of curve 37 in FIG. 2 is produced. The surface layer has a thickness of 1 micron. Under these conditions not all of the silane is decomposed and there remains sufficient excess propane so that it contributes as a carrier gas. Under other conditions a slightly convex configuration 43a or even a concave distribution 43b in FIG. 2 may be produced. No carbon trough is present however. Specifically, for a 5.6 mil monofilament the reagents comprised 9.0% silane and 15.4% propane with the remainder argon or nitrogen or a mixture of argon and nitrogen.

To construct a carbon-rich surface layer on a 3.1 mil (0.0031 inch) monofilament 12.1% silane and 34.4% propane with the remainder a carrier gas was used. The silane comprised a mixture of 87% dimethyldichlorosilane, 8% methyldichlorosilane and about 5% of other related silanes. The 3.1 mil SiC monofilament travels through the 7 inch section 41 at the rate of about 30 feet per minute.

These concentrations are illustrative because in practice not all of the reactants are consumed and a broad range of concentrations and flow rates will produce similar results. The temperatures are more important than concentrations to achieve the desired composition.

The flow rate of gases in these operations is classically difficult to measure accurately. Very often the absolute values will vary with the type of measuring instrument being used. Therefore the foregoing values are to be considered illustrative. The ratios are believed to be accurate.

While layer 16 has been described as a surface layer, it is to be understood that the invention also contemplates the overcoating of this carbon-rich silicon carbide surface layer, when desired, with a layer, for example, of material selected to enhance certain selected properties of the monofilament such as, for example, a layer of stoichiometric SiC, titanium diboride, etc. 25. A layer of titanium diboride, for example, further enhances the chemical resistance of the SiC fiber to matrix materials such as alpha or gamma titanium aluminides.

The 1 micron carbon-rich surface layer of the present invention simultaneously:

a) provides a high strength oxidation resistant surface;

b) provides a surface that is readily wet by molten aluminum alloys while shielding (protecting) the structural parts of the stoichiometric SiC fiber;

c) provides a surface that is readily bonded to aluminum alloys during casting, diffusion bonding, or hot molding consolidation processes; and d) provides a surface that is resistant to peeling and separation.

Monofilaments having a carbon-rich surface layer embodying the principals of the present invention and having a thickness in excess of about 1 micron (closer to 3 microns) are suitable for use in composites where the matrix material includes titanium or titanium aluminides. Surface coating thicknesses less than 1 micron may be used in organic matrix composites (e.g. epoxy, bismaleimides, etc.).

The net result of the foregoing is a commercially viable SiC monofilament having a carbon-rich surface structure made by means of a single pass through a reactor. Typically the monofilament will have 350 to 500 kpsi tensile strength which holds together when machined.

While the invention has been described with respect to preferred embodiments, it will be apparent to those skilled in the art that changes and modifications may be made without departing from the scope of the invention herein involved in its broader aspects. Accordingly, it is intended that all matter contained in the above description, or shown in the accompanying drawing shall be interpreted as illustrative and not in limiting sense.

I claim:

1. A high strength silicon carbide monofilament comprising:
   a core;
   a stoichiometric bulk layer of SiC deposited on the core;
   a carbon-rich SiC layer deposited on the bulk layer forming an interface with the SiC bulk layer, said carbon-rich SiC layer having a ratio of silicon to carbon which decreases almost linearly from a maximum value of 1 (stoichiometric) at the interface of SiC bulk layer and the carbon-rich SiC layer to a minimum value of about 0.43 (70% carbon, 30% silicon) at the exterior surface of the carbon-rich SiC surface layer.

2. A high strength monofilament as defined in claim 1 wherein the filament core is carbon.

3. A high strength monofilament as defined in claim 1 wherein the filament core is tungsten.

4. The monofilament as defined in claim 1 wherein the thickness of the surface layer is at least 0.1 micron.

5. A high strength silicon carbide monofilament comprising:
   a core;
   a stoichiometric bulk layer of SiC deposited on the core;
   a carbon-rich SiC layer deposited on the bulk layer forming an interface with the SiC bulk layer, said carbon-rich SiC layer having a ratio of silicon to carbon which decreases almost linearly from a maximum value of 1 (stoichiometric) at the interface of SiC bulk layer and the carbon-rich SiC layer to a minimum value of about 0.43 (70% carbon, 30% silicon ) at the exterior surface of the carbon-rich SiC surface layer; and
   an overcoating on the carbon-rich SiC layer of a layer of a material selected to enhance certain properties of the monofilament.

6. The high strength monofilament as defined in claim 5 wherein the overcoating layer comprises stoichiometric SiC.

7. The high strength monofilament as defined in claim 5 wherein the overcoating layer comprises titanium diboride.

* * * * *